United States Patent [19]

Drees et al.

[11] 4,026,008
[45] May 31, 1977

[54] SEMICONDUCTOR LEAD STRUCTURE AND ASSEMBLY AND METHOD FOR FABRICATING SAME

[75] Inventors: Joseph M. Drees, Saratoga; Fritz W. Beyerlein, Sunnyvale, both of Calif.

[73] Assignee: Signetics Corporation, Sunnyvale, Calif.

[22] Filed: May 19, 1975

[21] Appl. No.: 578,668

Related U.S. Application Data

[60] Division of Ser. No. 293,929, Oct. 2, 1972, Pat. No. 3,902,148, which is a continuation-in-part of Ser. No. 93,092, Nov. 27, 1970.

[52] U.S. Cl. .............................. 29/574; 29/576 S; 29/588; 357/70
[51] Int. Cl.² .......................................... B01J 17/00
[58] Field of Search ............... 29/574, 576 S, 588, 29/627; 357/70

[56] References Cited

UNITED STATES PATENTS

| | | | |
|---|---|---|---|
| 3,484,533 | 12/1969 | Kauffman | 29/576 S |
| 3,490,141 | 1/1970 | Lesk | 29/588 |
| 3,544,857 | 12/1970 | Byrne | 29/627 |
| 3,689,991 | 9/1972 | Aird | 29/576 S |
| 3,810,300 | 5/1974 | Hulmes | 29/574 |

*Primary Examiner*—W. Tupman
*Attorney, Agent, or Firm*—Flehr, Hohbach, Test, Albritton & Herbert

[57] ABSTRACT

A lead structure formed from a sheet of electrically conducting material having a plurality of spaced integral lead arrays formed therein with each of the arrays comprising a plurality of first leads formed from the sheet material in one region thereof and being integral with the sheet with each of the leads being cantilevered and having inner extremities which are free and positioned in a predetermined pattern. Portions of the first leads adjacent the free ends are convoluted. A semiconductor body having at least portions of an electrical circuit formed therein and with contacts in a predetermined pattern carried by the body and lying in a common plane is secured to each of the arrays with the contact pads being bonded to the inner extemities of the first leads. A first encapsulating means is provided for encapsulating the semiconductor body and the inner extremities of the first leads with the outer extremities of the first leads being free of the first encapsulating means. After the first encapsulation, the outer extremities of the first lead are separated from the sheet of material. A plurality of spaced second leads are then secured to the outer extremities of the first leads. A second encapsulating means is then provided for encapsulating the first encapsulating means, the outer extremities of the first leads and the inner extremities of the second leads with the outer extremities of the second leads being free.

10 Claims, 45 Drawing Figures

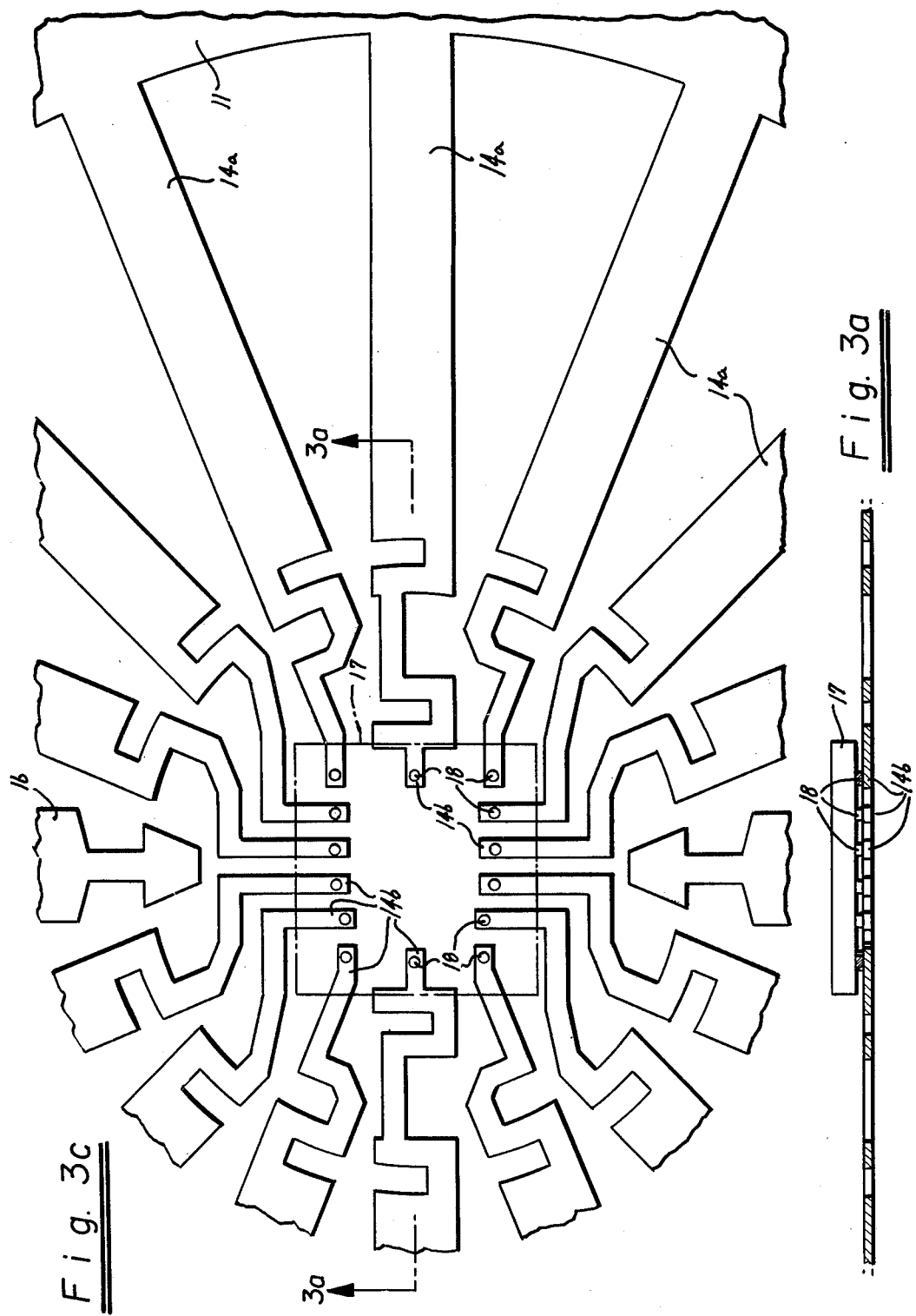

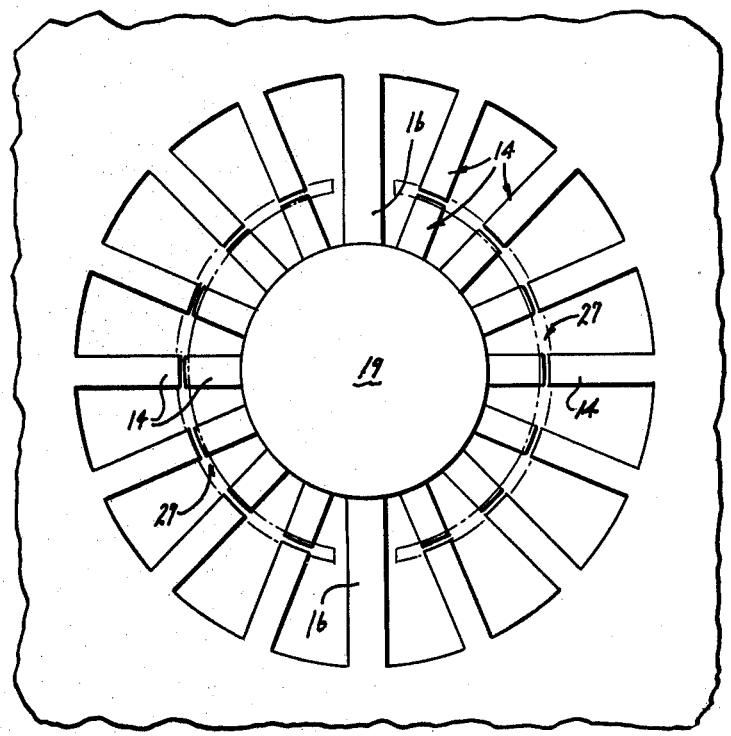
_Fig. 6_
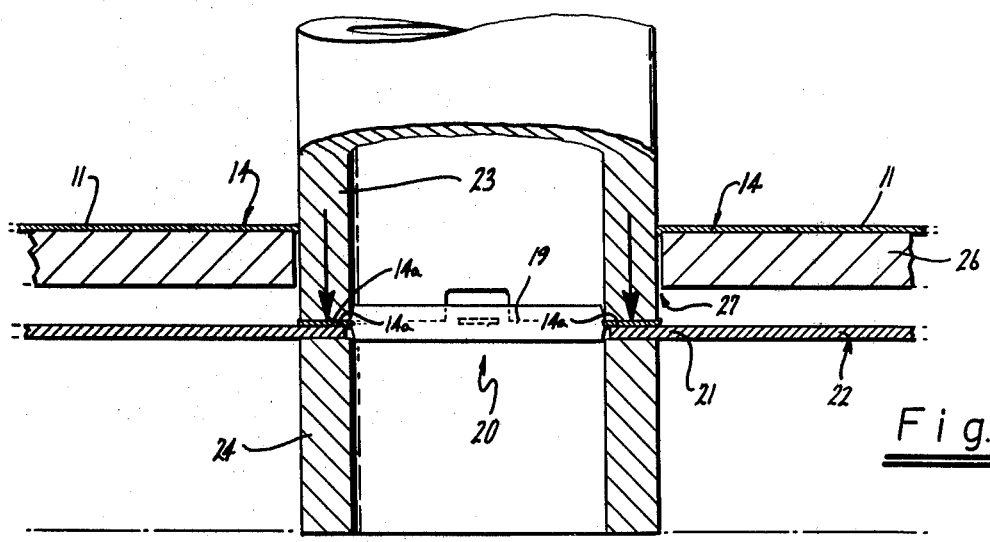
_Fig. 7_

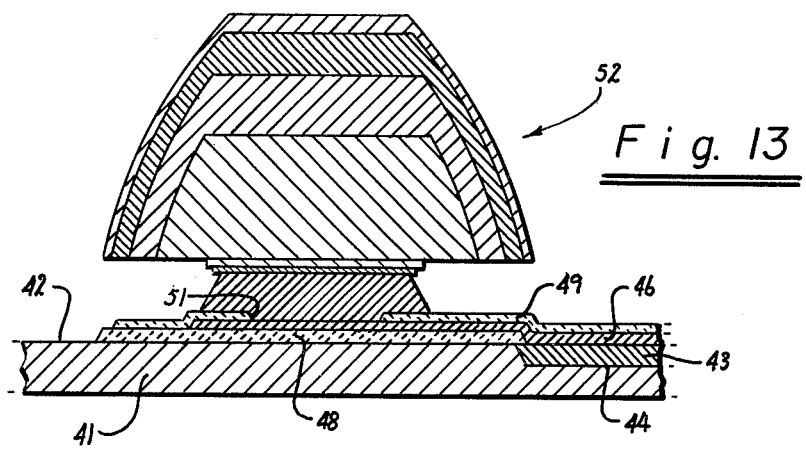
Fig. 13
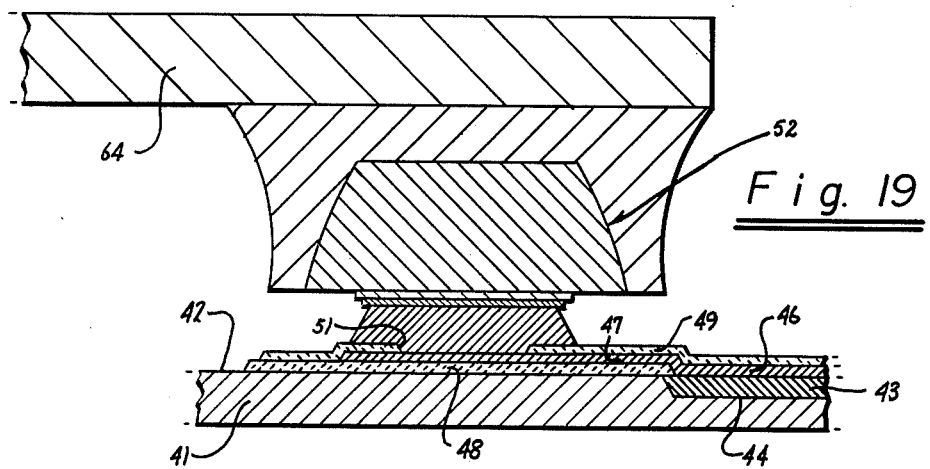
Fig. 19
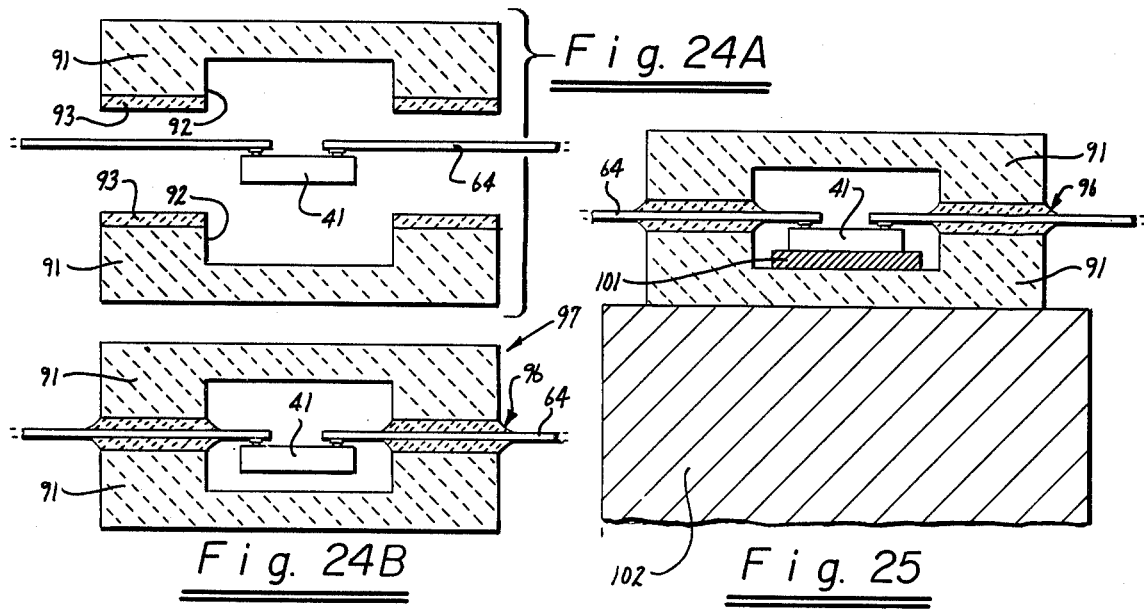
Fig. 24A
Fig. 24B
Fig. 25

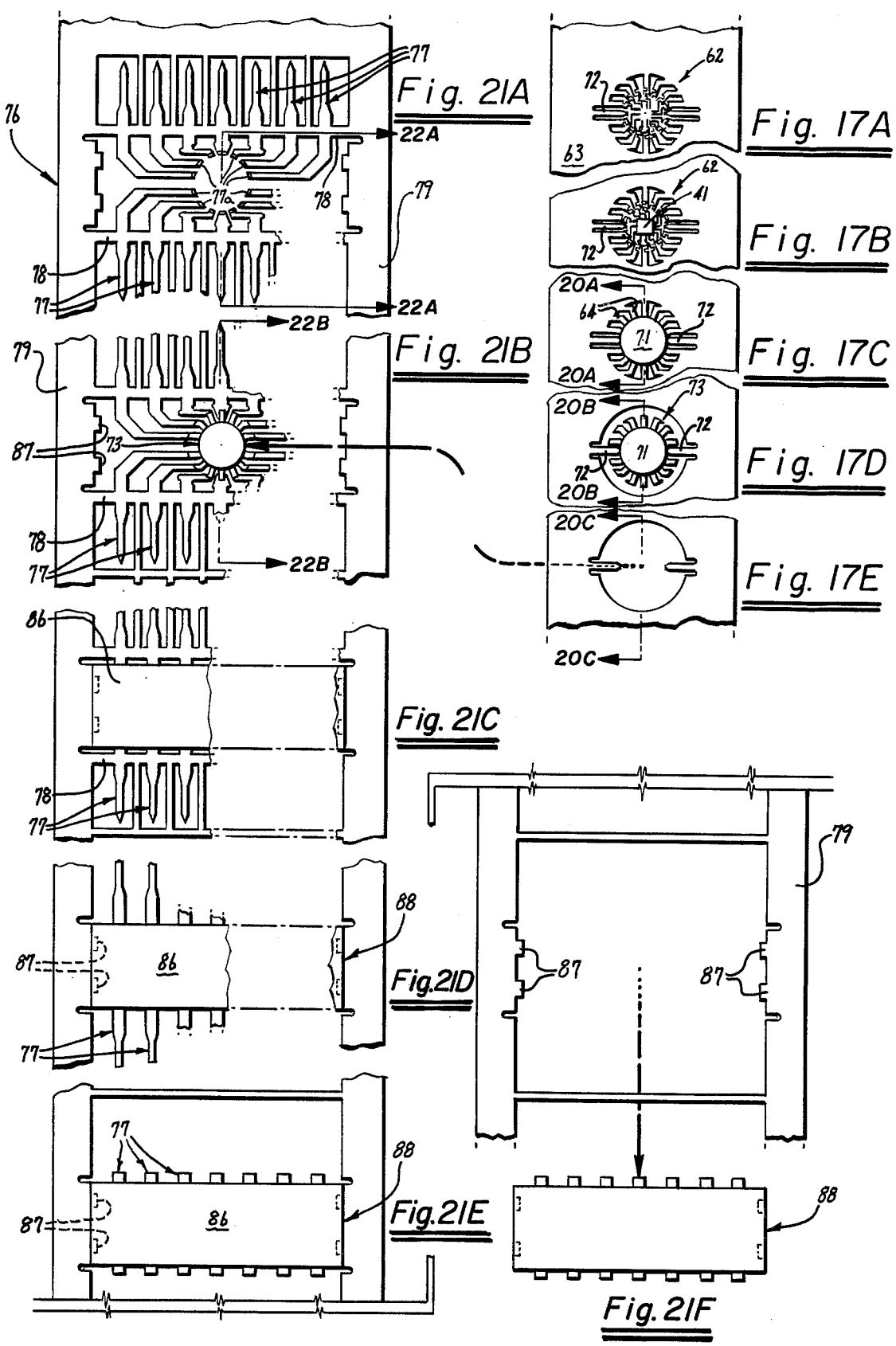

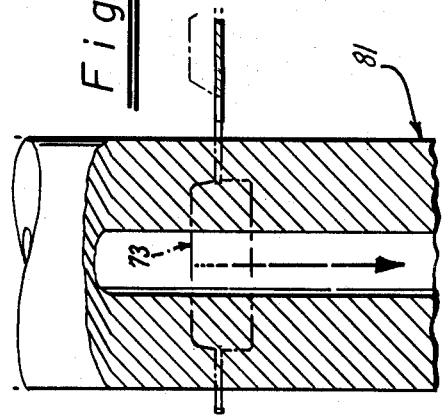
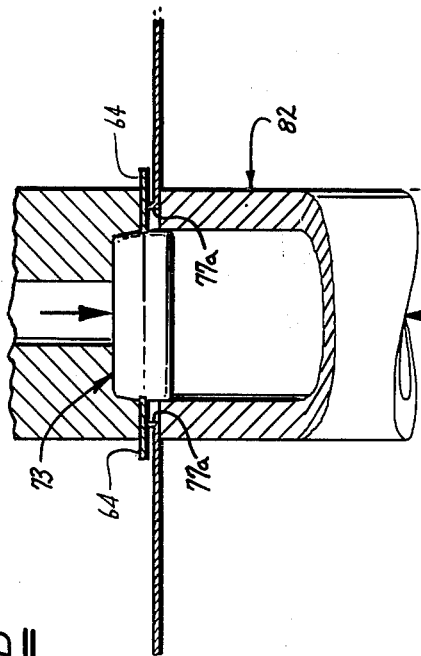
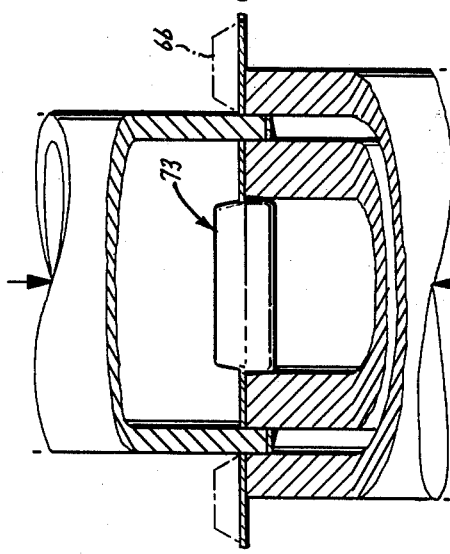
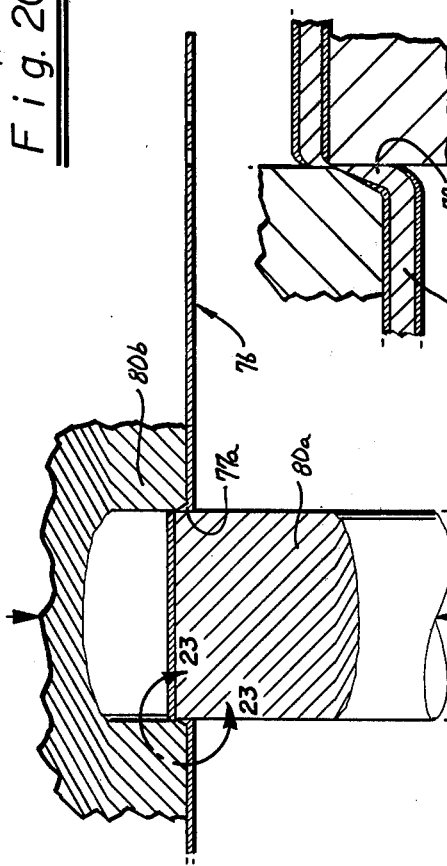
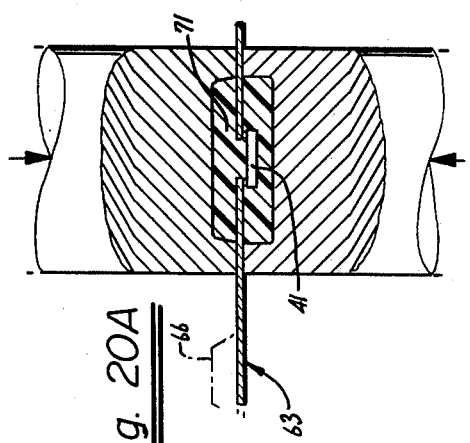
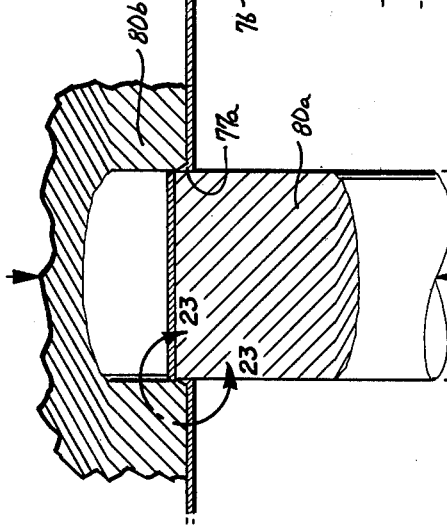

SEMICONDUCTOR LEAD STRUCTURE AND ASSEMBLY AND METHOD FOR FABRICATING SAME

CROSS REFERENCE TO RELATED APPLICATION

This is a division of application Ser. No. 293,929, filed Oct. 2, 1972, now U.S. Pat. No. 3,902,148, which is a continuation in part of application Ser. No. 93,092 filed on Nov. 27, 1970.

BACKGROUND OF THE INVENTION

This invention relates to semiconductor packages, lead structures, assemblies and methods for fabricating the same.

In the manufacture of integrated circuits, it is necessary that semiconductor bodies, which are of relatively small dimensions and which have electrical circuits formed therein according to techniques well known in the art, be connected in some manner to lead structures of relatively larger dimensions. Usually the semiconductor bodies together with portions of the lead structures are thereafter encapsulated in insulating material to form an integrated circuit package. In the past, such operations have required a great deal of hand labor which has made the packaging of integrated circuits very expensive and often has necessitated the use of relatively inexpensive foreign labor. There is, therefore, a great need for a new and improved semiconductor package, lead structure and assembly for fabricating the same.

SUMMARY OF THE INVENTION AND OBJECTS

The semiconductor lead structure comprises a sheet of electrically conducting material having a plurality of spaced integral lead arrays formed therein with each of the lead arrays comprising a plurality of leads formed from the sheet material in one region thereof and being integral therewith. Each of the leads of the array is cantilevered and extends inwardly with its inner end being free. The free inner ends of the first leads have positions which conform to a predetermined pattern. Portions of the leads adjacent the free ends are convoluted. At least one support tab is provided in each of the lead arrays which is cantilevered and also extends inwardly to a region which is adjacent the inner extremities of the first leads but being out of contact with said first leads. A semiconductor body having at least portions of an electrical circuit formed therein and with contact pads in a predetermined pattern carried by the body and lying in a common plane is provided. Means is provided for forming a bond between the contact pads of the semiconductor body and the inner extremities of the first leads. A first encapsulating means is provided for encapsulating the semiconductor body and inner extremities of the first leads and the inner extremity of the support tab but leaving the outer extremities of said first leads free of the first encapsulating means. The first leads are then severed from the sheet material while the support tab still retains the semiconductor body with its first leads and the first encapsulating means supported by the sheet material to permit electrical testing of the electrical device carried by the semiconductor body. A plurality of spaced second leads are provided. The inner extremities of the second leads are bonded to the outer extremities of the first leads. A second encapsulating means is provided for encapsulating the first encapsulating means, the outer extremities of said first leads and the inner extremities of said second leads while leaving the outer extremities of the second leads free of the second encapsulating means.

In general, it is an object of the present invention to provide a semiconductor lead structure, assembly and method for fabricating the same which greatly reduces the hand labor required for making the same.

Another object of the invention is to provide a lead structure, assembly and method of the above character in which costs are greatly reduced.

Another object of the invention is to provide a lead structure and method of the above character which lends itself to automatic packaging for semiconductor devices.

Another object of the invention is to provide assembly and method of the above character in which dual encapsulation is utilized.

Another object of the invention is to provide a lead structure, assembly and method of the above character in which damage caused by handling is greatly reduced.

Another object of the invention is to provide a lead structure and assembly of the above character in which the integrity of the connections between the semiconductor body and the leads is greatly enhanced.

Another object of the invention is to provide a lead structure and assembly which includes means for preventing mechanical shock from degrading the bonds which have been formed.

Another object of the invention is to provide a structure and assembly of the above character which makes it possible to utilize plastic for the encapsulating material.

Another object of the invention is to provide an assembly and method of the above character in which thermal stresses are minimized during thermal cycling.

Another object of the invention is to provide a semiconductor assembly of the above character which provides an excellent moisture seal for the metal leads.

Another object of the invention is to provide a semiconductor assembly and method of the above character which makes it possible to utilize the dual in-line packaging form.

Another object of the invention is to provide a semiconductor assembly and method of the above character in which relatively inexpensive lead frames can be utilized for making contact to the outside world.

Another object of the invention is to provide a semiconductor assembly and method of the above character which makes it possible to utilize a first encapsulating material which provides high reliability and a second encapsulating material which makes it possible to provide good mechanical strength at low cost.

Another object of the invention is to provide a method of the above character which makes it possible to fabricate the semiconductor lead structure and assembly in continuous strips.

Another object of the invention is to provide a semiconductor lead structure, assembly and method of the above character is which raised projections are provided on the back to facilitate forming excellent welds between leads.

Another object of the invention is to provide a semiconductor lead structure, assembly and method of the above character in which excellent Kovar-to-steel welds are obtained.

Another object of the invention is to provide a semiconductor lead structure of the above character in which the first encapsulating means takes the form of a pill-like package.

Another object of the invention is to provide a semiconductor lead structure, assembly and method of the above character in which blind support tabs are provided for supporting the pill-like package to permit testing of the semiconductor body within the pill-like package while being held in place and in alignment in the lead structure.

Another object of the invention is to provide a method of the above character in which the dies which make up the semiconductor bodies are maintained in their original locations which they had during fabrication.

Another object of the invention is to provide a method of the above character in which the pill-like packages are carried in large sheets which can be coiled to permit automatic strip handling.

Another object of the invention is to provide a method of the above character in which overlapping order principles are utilized.

Another object of the invention is to provide a method of the above character in which the order is maintained throughout the process.

Additional objects and features of the invention will appear from the following description in which the preferred embodiments are set forth in detail in conjunction with the accompanying drawings.

BRIEF DESCRIPTION OF THE DRAWINGS

FIG. 3a is a cross-sectional view taken along the line 3a—3a of FIG. 3c.

FIG. 3c is a cross-sectional view taken along the line 3c—3c of FIG. 3a.

FIG. 6 is a top plan view showing the structure in FIG. 5 with the portions of the leads of the lead array extending out of the first encapsulating means being severed from the sheet of electrically conducting material but with the blind support tabs intact.

FIG. 7 is a schematic illustration partly in cross-section illustrating the manner in which the assembly shown in FIG. 6 is separated from the electrically conducting sheet and having the outer extremities of the first leads bonded to the inner extremities of second leads forming a part of relatively large lead frames.

FIG. 13 is an enlarged cross-sectional view of one of the bumps formed on contact pads of a semiconductor body.

FIGS. 17A through 17E are top plan views showing the steps which are used in forming the semiconductor lead structure and the pill-like package utilizing automatic production techniques.

FIG. 19 is an enlarged cross-sectional view showing a lead soldered to a bump carried by a semiconductor body.

FIGS. 20A, 20B and 20C are schematic illustrations partly in cross-section taken along the lines 20A-20A, 20B-20B and 20C-20C of FIGS. 17C, 17D and 17E, respectively, showing the manner in which the pill-like package is formed, the leads sheared and the package welded to the lead frame as represented by the views shown in FIGS. 17C, 17D and 17E respectively.

FIGS. 21A through 21F are top plan views showing the progressive steps for manufacturing a lead frame strip, incorporating the pill-like package in the lead frame strip and forming the completed semiconductor package utilizing automated production techniques.

FIGS. 22A and 22B are cross-sectional views taken along the lines 22A-22A and 22B of FIGS. 21A and 21B.

FIG. 23 is an enlarged view showing the area encircled by the line 23-23 in FIG. 22A and particularly shows the forming of weld projections on lead frame strip.

FIGS. 24A and 24B show the steps in utilizing the present invention in conjunction with a hermetically sealed ceramic package.

FIG. 25 is a cross-sectional view showing the manner in which the hermetically sealed package shown in FIGS. 24A and 24B can be utilized in conjunction with a heat sink.

DESCRIPTION OF THE PREFERRED EMBODIMENTS

Figure 1:
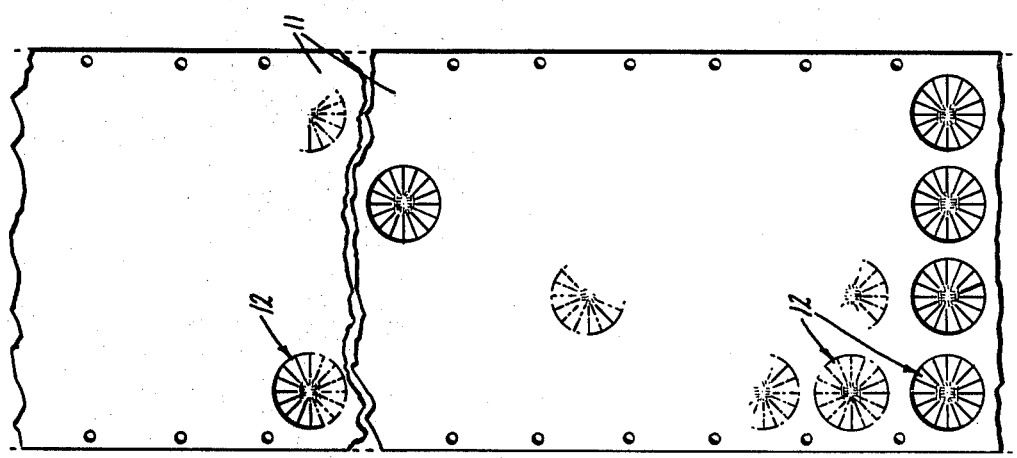
FIG. 1 is a top plan view of a sheet of electrically conducting material showing a plurality of spaced lead arrays formed therein.
Figure 2:
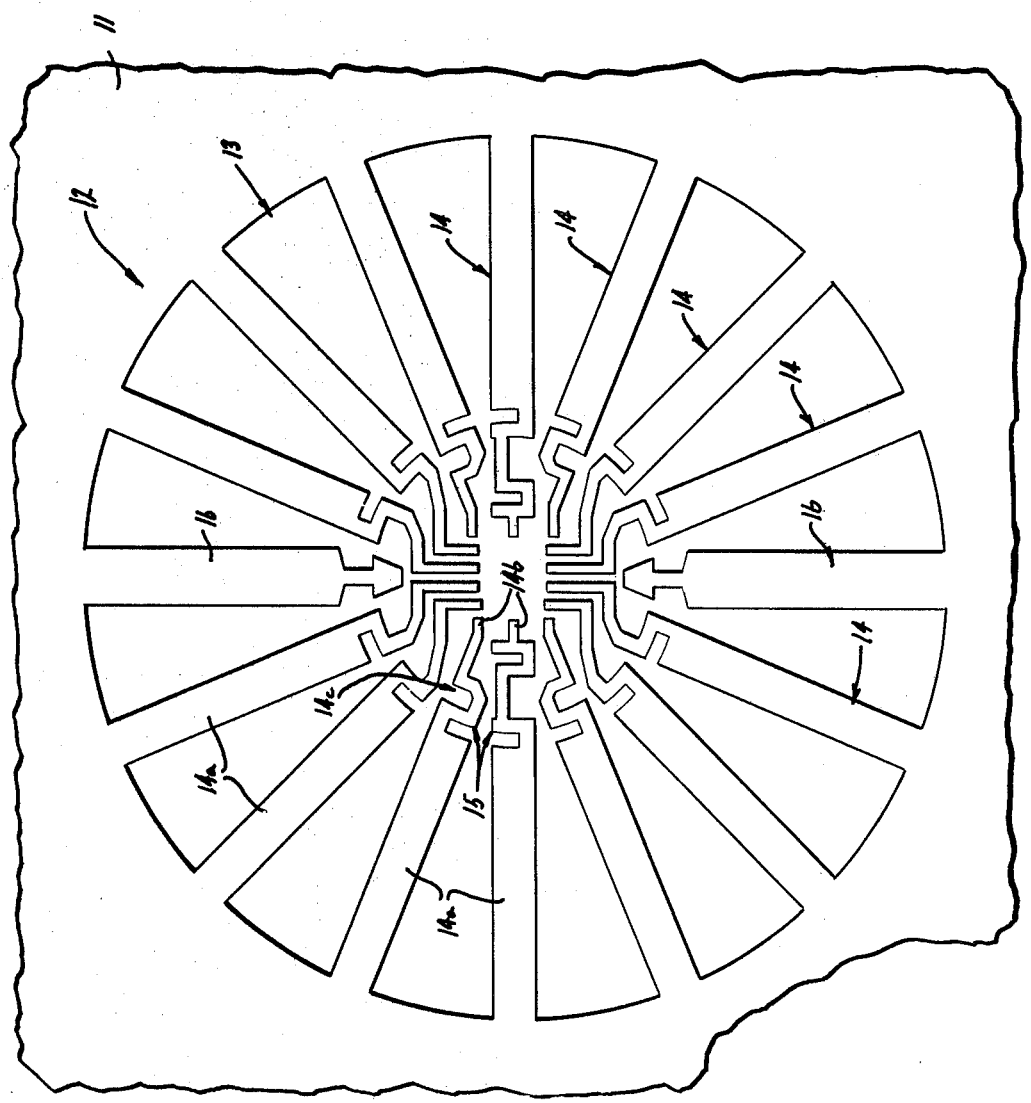
FIG. 2 is a greatly enlarged view of a portion of the sheet of material shown in FIG. 1 and in particular showing one of the lead arrays.

FIG. 1 is a top plan view of a lead structure in the form of a sheet 11 of a suitable electrically conducting material such as gold-plated Kovar and having a plurality of spaced and separate lead arrays or spider frames 12 formed therein. FIG. 2 is a greatly enlarged view of a portion of the sheet material 11 illustrating one of the lead arrays 12.

Sheet 11 is of a relatively thin material having a normal thickness, as for example, of 0.0025 inches. Due to this thickness the lead arrays 12 may be formed in the sheet of material 11 by conventional photolithographic techniques. For example, a photoresist process can be used in which the desired lead structure is photographically exposed onto a layer of resist coating the sheet of material. Subsequently, the exposed portions of the resist are removed and the remaining portions of the resist serve as a pattern mask for an etch such as a hydrochloric acid etch in which the desired pattern is produced in the sheet 11.

Alternatively, the desired pattern can be obtained by utilizing dies in a press to form the pattern. However, there are at least two advantages in utilizing a photolithograhic process rather than stamping to form the patterns for the lead arrays 12. First, in the manufacture of packaged integrated circuits, semiconductor bodies of varying configurations are utilized, these varying semiconductor bodies having predetermined different patterns of contact pads. Since it is necessary that the lead arrays 12 also have portions thereof disposed in the predetermined patterns, there must be a capability for producing varying configurations of lead arrays. It is much less expensive to produce these varying configurations of lead arrays with a photolithographic process rather than make expensive dies for each configuration. Secondly, the semiconductor bodies are of relatively small dimensions so that the portions of the lead arrays adapted to be bonded to the contact pads thereof are also of very small dimensions. It is difficult to provide dies capable of precisely forming such small lead configurations, while the photolithographic techniques it is possible to produce precise small lead configurations.

Each lead array 12 generally comprises a plurality of spaced contact leads 14 formed from the sheet 11 and cantilevered inwardly and generally radially into a central opening 13. The contact leads 14 have spaced apart outer extremities 14a and inner contact areas 14b. The inner contact areas 14b are disposed in a predetermined pattern adjacent the center of the central opening 13. Each of the contact leads 14 has a convoluted portion 14c intermediate the spaced apart extremity 14a and the inner contact area 14b but preferably adjacent the inner contact area 14b. A semiconductor body having contact pads arranged in the same predetermined pattern as the inner contact areas is later bonded to the inner contact areas 14b. Mechanical stresses or shocks applied to the contact leads 14 or thermal stresses induced by bonding operations can degrade or even rupture entirely these bonds between the inner contact areas and contact pads. The convoluted portions 14c, however, are designed to flex under the influence of mechanical shock so as to absorb the shock rather than transmit it to the inner contact areas 14b and also to accommodate differential thermal expansion of the leads 14 and the sheet 11. The convoluted portions 14c also each include a portion defining a notch 15 which, as more fully discussed hereinafter, serve to anchor the contact leads 14 in an insulating material which is later applied as an encapsulation. Each of the lead arrays 12 also includes at least one and preferably two cantilevered inwardly and generally radially extending support tabs 16 which are formed in the sheet 11 and which extend into the opening 13 for a distance which is less than that of the leads 14. The purpose of the support tabs 16 is fully discussed hereinafter.

Figure 3B:
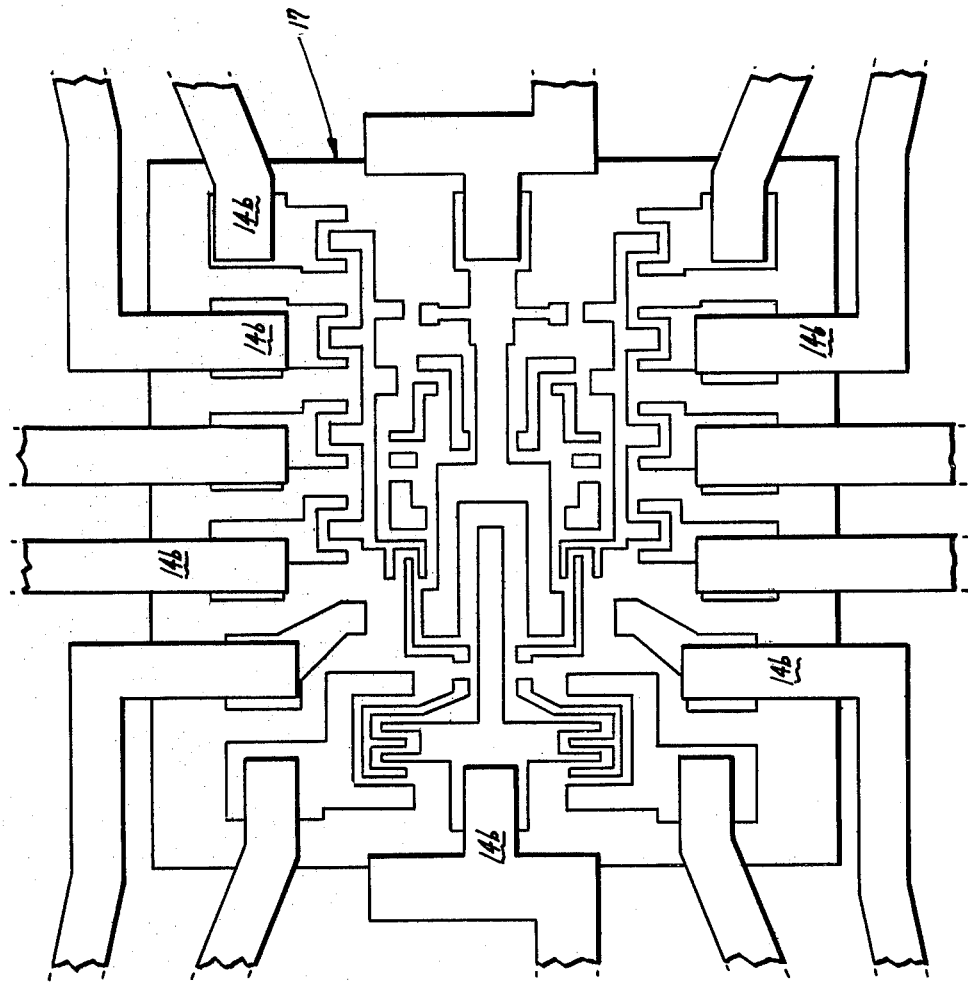
FIG. 3b is a greatly enlarged partial plan view of the lead array showing a semiconductor chip bonded thereto.

Referring now to FIGS. 3a and 3b, there is illustrated the manner in which a semiconductor body or chip 17 is mounted to the inner contact areas of the lead structures in the sheet of electrically conducting material 11. The semiconductor body 17 in accordance with techniques well known in the art has at least portions of an electrical circuit formed therein and may include both active and passive devices such as in an integrated circuit. Contact pads 18 are carried in a common plane on one surface of the semiconductor body by the semiconductor body 17 and are arranged in a predetermined pattern exclusively adjacent the outer perimeter of the body 17. Appropriate metallization may be provided on semiconductor body 17 for connecting the electrical circuits formed therein to the contact pads 18. The semiconductor body 17 is positioned with the contact pads 18 which are arranged in a predetermined pattern aligned with the inner contact areas 14b of the leads 14 of the lead array which are also arranged in the predetermined pattern. The contact pads 18 are then bonded to the inner contact areas through any of several techniques well known to the art. For example, solder may be provided on the contact pads and a nitrogen torch utilized for melting the solder to form a bond between the contact pads and inner contact areas of the lead structures. alternative bonding methods such as ultrasonic bonding as described in U.S. Pat. No. 3,255,511 to Weissenstern et al., are also suitable.

Figure 5:
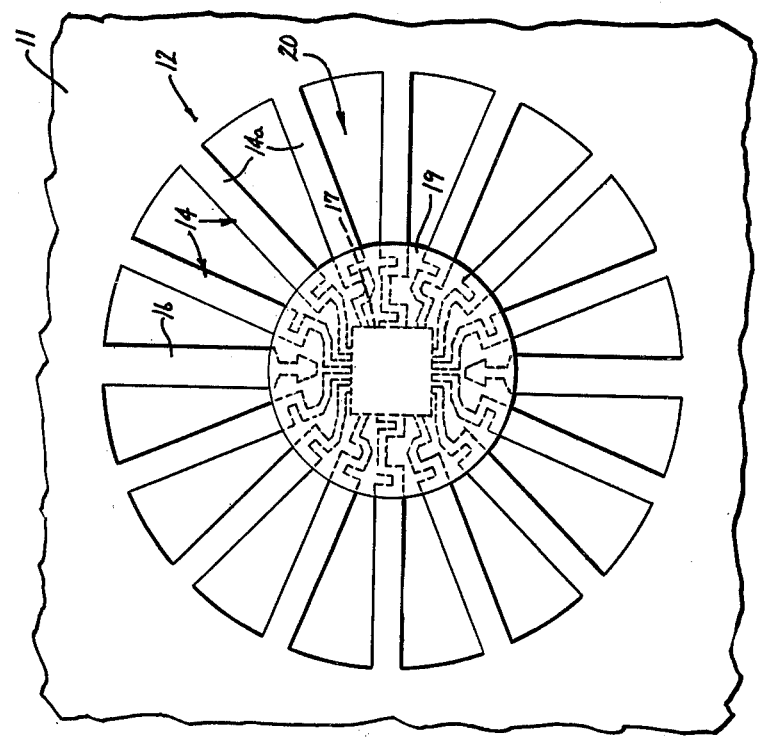
FIG. 5 is a partial top plan view of the lead array as shown in FIG. 4 with the semiconductor body, the inner extremities of the leads of the array and the inner extremities of the blind support tabs encapsulated within a first encapsulating means.
Figure 4:
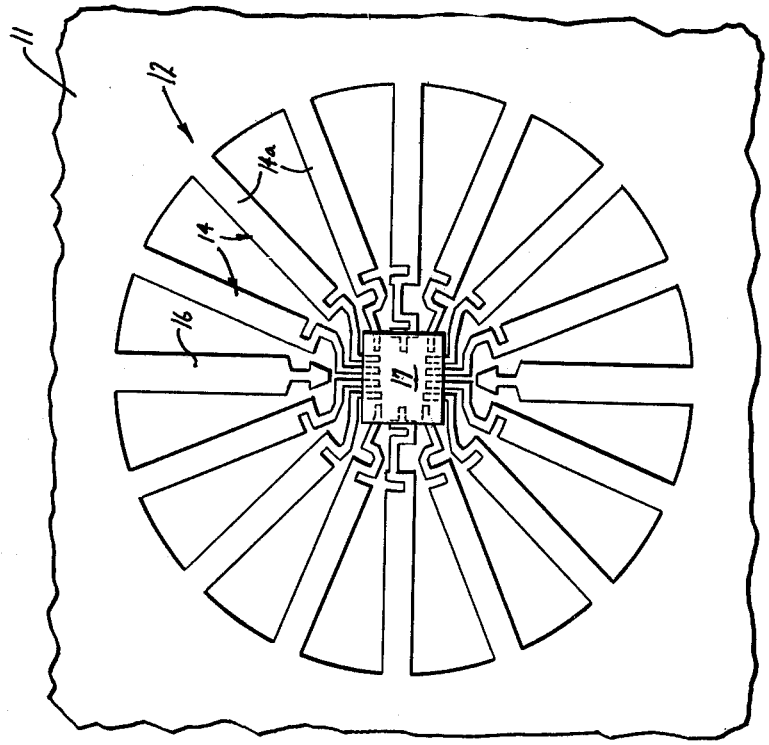
FIG. 4 is a partial plan view of one of the lead arrays as shown in FIG. 1 showing the semiconductor chip bonded to the inner extremities of the leads of the lead array.

FIG. 4 shows a plan view of the contact lead array 12 with the semiconductor body 17 attached thereto. After the semiconductor body 17 has been attached to the lead structure 12, the semiconductor body 17 and convoluted portions 14c of the contact leads 14 are encapsulated in a first encapsulating means 19 of an insulating material which may be a suitable plastic to form a packaged integrated circuit 20. The encapsulating means 19 is in the form of a disc and thus may be termed a pill or pill-like package with the outer extremities of the leads 14 being free of the insulating material. The encapsulation for all the packaged integrated circuits 20 may be accomplished simultaneously or it may be accomplished sequentially. In accordance with techniques well known in the art a conformal coating of liquid silicon may be applied to the semiconductor body 17 and portions of the contact leads 14, followed by an injection molding process for applying the plastic insulating material. As can be seen from FIG. 5, the encapsulation material encompasses an inner portion of the supporting tabs 16 and encompasses the convoluted portions 14c of the contact leads including the notches 15 formed therein.

After encapsulation, the spaced apart extremities 14a of the contact leads 14 are severed from the sheet of electrically conducting material 11 so as to isolate them mechanically and electrically with respect to the sheet 11 as shown in FIG. 6. After the spaced apart extremities 14a are severed, the first encapsulation or pill 19 with the contact leads 14 extending therefrom forms a pill like package or a packaged integrated circuit 20 which has the appearance of a spider and which is retained by the supporting tabs 16 extending into the first encapsulation 19. This arrangement permits the pill-like packages to be retained in the sheet 11 which may, for example, contain 100 or more packaged integrated circuits or pill-like packages. Since the contact leads 14 are free of and not electrically short-circuited by the sheet of electrically conducting material 11, the packaged integrated circuits 20 can be and are preferably electrically tested while retained in the sheet. This minimizes the amount of individual handling of packaged integrated circuits inasmuch as they may be handled in groups, as for example, 100 to a sheet.

When it is desired to remove the packaged integrated circuits 20 from sheet 11, the supporting tabs 16 may be broken at the edge of the encapsulation 19 by merely manually pushing against the packaged integrated circuits 20.

Alternatively, the packaged integrated circuits may be automatically punched out of the sheet 11 simultaneously and attached to a larger lead frame. Also, they can first be welded or attached to the lead frame and then ripped out or separated from the sheet 11. The purpose of attaching the packaged integrated circuits or pill-like packages to larger lead frames is to provide more substantial means for electrical connection between the outside world and the circuits and components of the encapsulated semiconductor body. It will be recalled that the sheet 11 in which the contact leads are formed is relatively thin, having a nominal thickness, for example, of 0.0025 inches. This thickness is rather insubstantial for packaged integrated circuits which it is contemplated will be directly plugged into printed circuit boards or connectors. Therefore, in accordance with this invention, the packaged integrated circuits 20 are attached to a larger lead frame which has a nominal thickness of 10 mils, for example. A plurality of lead frames 21 are formed in a lead-frame strip 22 which may be gold-plated Kovar. The lead frames 21 are formed with dies and each include a plurality of leads 28 having spaced outer terminal portions 28a and inner terminal portions 28b which are arranged in the predetermined pattern of the spaced extremities 14a of the pill-like package or packaged integrated circuit 20. The lead frame 21 also has outer portions 29 which have a plurality of tabs 31 extending inwardly toward the inner terminal portions 28b. It is the spaced extremities 14a of the packaged integrated circuit which are attached to the larger lead frame. The spaced extremities 14a are relatively wide and spaced a relatively wide distance apart so that the dimensions of the larger lead frame may be sufficiently large that it can conveniently be formed by means of dies.

Referring to FIG. 7, there is shown one of the pill-like packages or packaged integrated circuits 20 being punched out of the sheet 11 and attached to a lead frame 21. It should be understood that the lead frame 21 is part of a larger lead strip 22 and that all of the packaged integrated circuits 20 which are retained in sheet 11 (say 100, for example) may either simultaneously or sequentially be punched out of the sheet 11 and attached to lead frames in one or more lead-frame strips 22. Because the packaged integrated circuis 20 are retained in the sheet 11, individual alignment of each of the packaged integrated circuits 20 is not necessary. It is only necessary to align the sheet 11 with respect to the lead frames 21.

Figure 8:
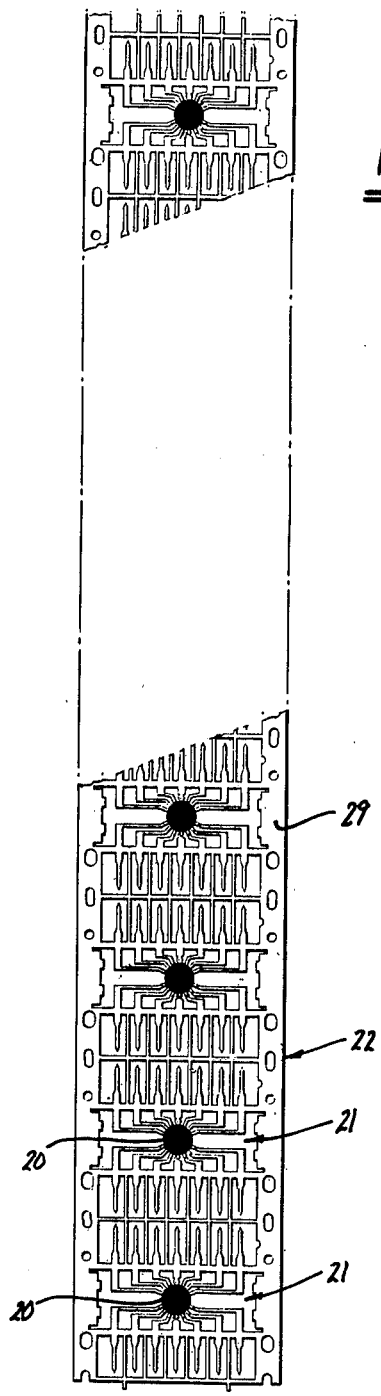
FIG. 8 is a top plan view of a strip of lead frames showing a plurality of pill-like packages mounted thereon.

In FIG. 7, an upper welding electrode 23 and a lower welding electrode 24 are provided. The lower welding electrode is a circular stationary electrode and lead frame 21 rests thereon. A guide 26 is provided on top of which the sheet 11 with the packaged integrated circuits 20 therein rests. The guide 26 has openings with which the packaged integrated circuits 20 in sheet 11 are aligned and through which they will pass. The upper welding electrode 24 is a circular movable electrode and is moved downwardly to engage the spaced extremities 14a of the contact leads of packaged integrated circuit 20. Continued downward movement of the upper welding electrode breaks the supporting tabs 16 and bends them out of the path of upper welding electrode 23. The upper welding electrode 23 is hollow and a vacuum is applied thereto so that the packaged integrated circuit 20 may be held by the upper welding electrode 23 during its downward travel. Finally, the spaced extremities 14a of the packaged integrated circuit 20 come to rest against the lead frame 21 and are welded thereto due to electrical current passing from one of the welding electrodes through the spaced extremities 14a and lead frame 21 to the other welding electrode. The upper welding electrode 23 is then withdrawn and the sequence repeated until the lead strip 22 has a plurality of pill-like packages or packaged integrated circuits 20 attached to lead frame 21 as shown in FIG. 8.

Figure 9:
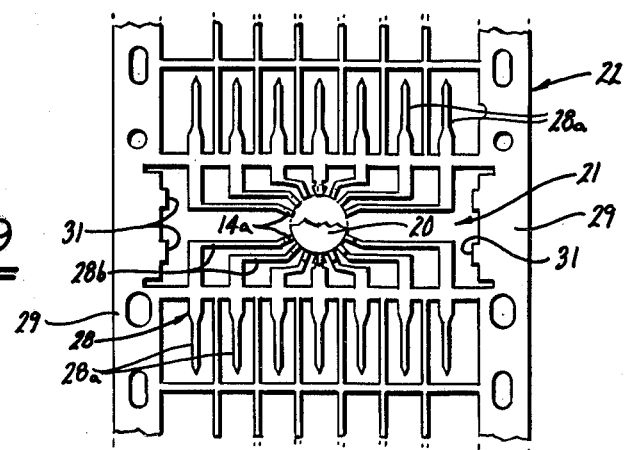
FIG. 9 is an enlarged top plan view of a portion of the strip shown in FIG. 8.

Referring now to FIG. 9, there is shown an enlarged view of one of the lead frames 21 with a pill-like package or a packaged integrated circuit 20 attached thereto. The lead frame 21 includes a plurality of leads 28 having spaced outer terminal portions 28a and inner terminal portions 28b which are arranged in the predetermined pattern of the spaced extremities 14a of packaged integrated circuit 20 and which are connected thereto. The lead frame 21 also has outer portions 29 which have a plurality of tabs 31 extending inwardly toward the packaged integrated circuit 20.

Figure 10:
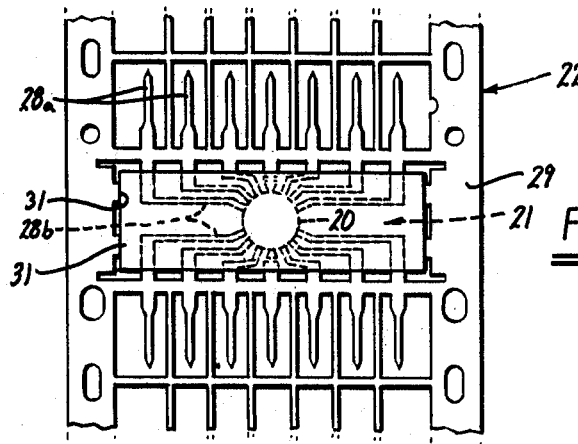
FIG. 10 is a top plan view of a portion of the strip shown in FIG. 8 with the pill-like package and inner extremities of the lead frame forming the second leads being encapsulated in second encapsulating means.

After the packaged integrated circuits or pill-like packages 20 are attached to the lead frames 21, the packaged integrated circuits 20 and portions of the lead frames 21 are encapsulated in second encapsulating means 32 of a suitable material such as plastic to form a dual in-line package 33 having a conventional configuration. FIG. 10 is similar to FIG. 9 and shows the second encapsulating means 32 in place. It should be noted that the insulating material encompasses the tabs 31.

Figure 12:
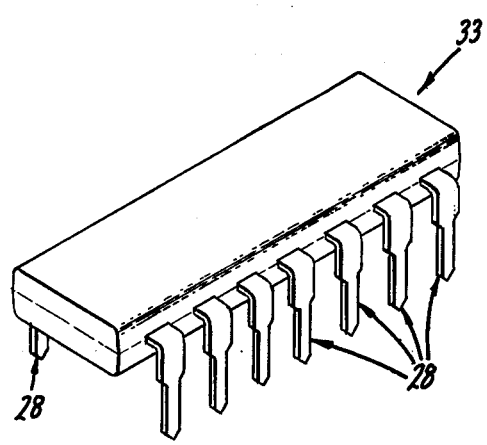
FIG. 12 is an isometric view of the completed semiconductor assembly having a conventional dual in-line configuration.
Figure 11:
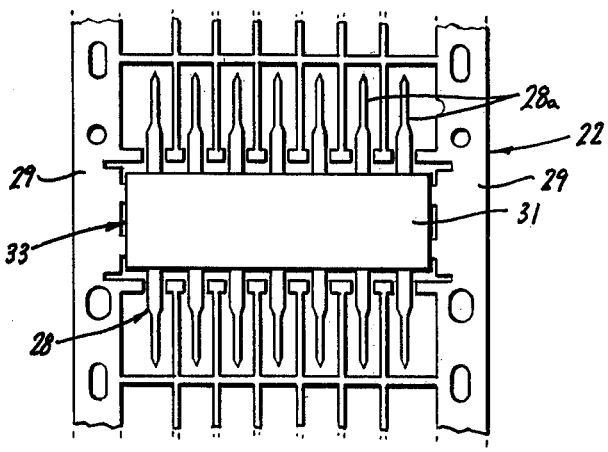
FIG. 11 is a top plan view similar to FIG. 10 but showing the second leads severed from the lead frame.

After encapsulation the lead frame 21 undergoes a severing operation in which the leads 28 are severed from the outer portions 29 of lead frame 21 and from each other to form a structure such as shown in FIG. 11. The leads 28 are mechanically and electrically separated from each other with the packaged assembly or package 33 being retained in the lead frame 21 by the tabs 31. The packaged assembly 33 can then be electrically tested while still retained by the lead frame 21 since the leads 28 are not short-circuited to themselves or to other portions of the lead frame 21. The packaged assemblies 33 may then be separated from the lead frame strip 22 by simply manually pushing on the assemblies 33 so as to cause the tabs 31 to be withdrawn from the second encapsulating means 32. The resulting packaged assembly 33 may then underto a lead bending operation to form a dual in-line package 33 such as shown in FIG. 12 with the bent leads 28 adapted to be inserted into connectors or printed circuit boards.

In FIGS. 13 through 23, there are shown the steps for forming a semiconductor lead structure and the semiconductor assembly with a method which, if desired, can be completely automatic. In utilizing the method or process, a semiconductor wafer 39 is processed in the conventional manner to provide a plurality of semiconductor chips or bodies 41 which have formed therein a plurality of devices which may include active and passive devices, formed in the semiconductor material and with regions of the devices extending to a surface 42 of the semiconductor body (see FIG. 13). As shown in FIG. 13, the devices can be formed by P or N type diffused regions 43 defined by dish-shaped PN junctions 44 which extend to the surface 42. Contact is made to the diffused regions 43 which extend to the surface by means of contact elements 46 connected to contact pads 47 provided on the surface of an insulating layer 48 formed on the surface 42. A layer 49 of suitable insulating material such as glass is formed over the contact elements 46 and the pads 47. Openings 51 are formed in the insulating material 40 by suitable means such as etching and bumps 52 formed therein in contact with the pads 47 extend upwardly through the openings 51. The bumps are generally mushroom-shaped as is shown in FIG. 13. The bumps utilize a relatively complex metallurgical system and are of the type described in copending application Ser. No. 238,116, filed Mar. 27, 1972. After the chips have been completed with the bumps formed thereon, the wafer is mounted on the carrier 56 formed of a suitable material such as gold-plated Kovar and which has a rectangular pattern of perforations or holes 57 provided therein. The wafer 39 is mounted with wax upon one side of the carrier 56 in an aligned manner so that each of the individual dies or chips has a hole or perforation 57 below the same (see FIGS. 14 and 15). The dies or chips are then separated in a suitable manner such as by a laser beam to provide a 0.001 inch cerf 58 between the dies or chips mounted on the carrier 56.

As explained in copending application Ser. No. 198,813, filed Nov. 15, 1971, the wafer carrier 56 is then moved in the bonding machine as shown schematically in FIG. 15 with the orientation of the carrier 56 being carefully controlled. The bonding machine includes a controlled table (not shown) moving along x and y axes so that the dies 41 on the wafer can be advanced in sequence into the centerline of the machine where the bonding operation takes place. The machine includes a heated vacuum chuck 61 of a size so that it can extend through the holes or perforations 57 (see FIG. 16). As soon as the wafer 39 has been shifted to the proper position, the vacuum chuck 61 moves upwardly through the hole 57 underlying the selected chip 41 and causes the wax to be melted so that the semiconductor body or chip 41 can be moved upwardly into contact with one of a plurality of spaced lead arrays or spiders 62 formed in a sheet or frame 63.

The sheet 63 forms the lead structure hereinbefore described with each of the arrays 62 comprising a plurality of leads 64 formed from the sheet material in one region thereof and being integral therewith. Each of the leads is cantilevered and extends inwardly with its inner end being free. The inner ends of the leads have positions which conform to the pattern of the contact pads on the semiconductor body or chip 41. Portions of the leads remote from their free ends have positions which correspond to another predetermined pattern for a purpose hereinafter described. As in the previous embodiments, portions of the leads 64 adjacent the free ends are convoluted.

Figure 16:
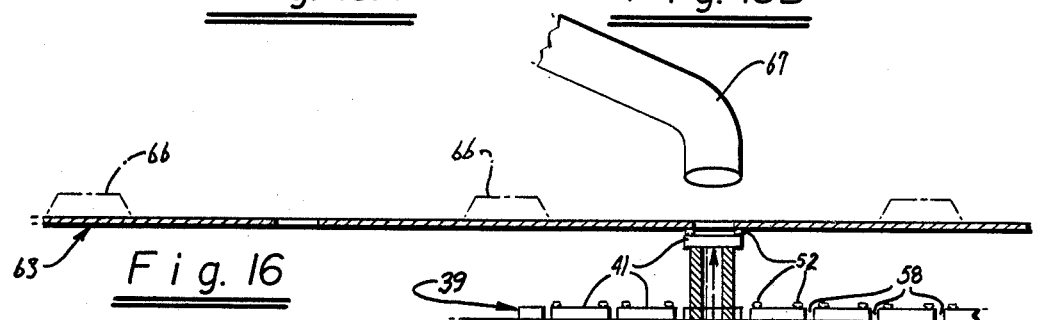
FIG. 16 is a schematic illustration showing the manner in which a semiconductor chip is bonded to an array of leads.
Figures 14, 15:
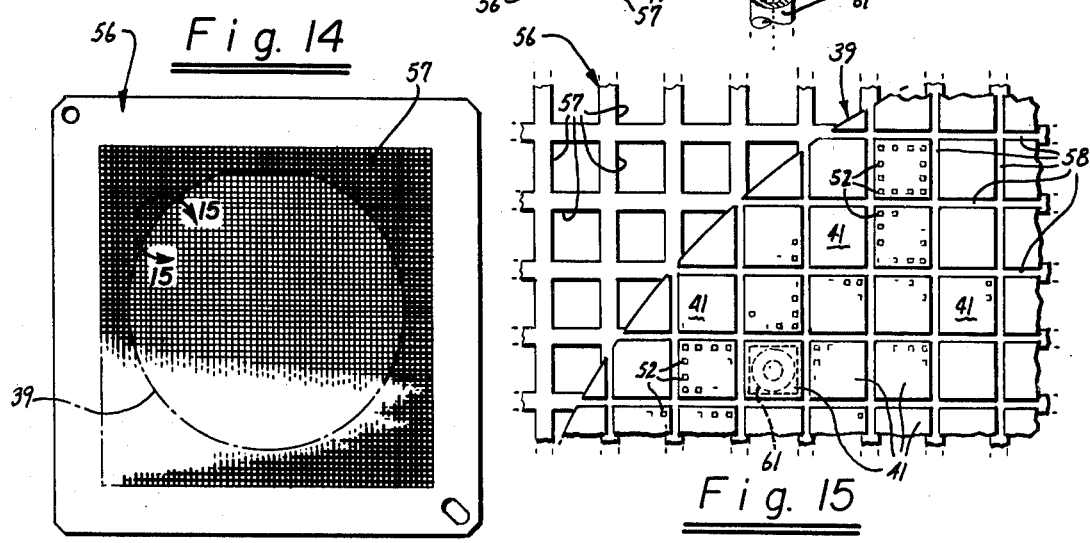
FIG. 14 is a top plan view of a semiconductor wafer on a wafer carrier.
FIG. 15 is an enlarged portion of the area encircled by the line 15—15 in FIG. 14.

The sheet or frame 63 is carried by a carrier 66 which is mounted in a conventional x-y stepping stage so that the movement of the sheet 63 can be automatically coordinated with that of the carrier 56. As shown in FIG. 16, a die 41 is pushed upwardly by the heated vacuum chuck 61 into contact with one of the lead arrays 62 so that the bumps 52 carried by the semiconductor chip 41 come into contact with the tips or inner extremities of the leads 64. A forming gas such as nitrogen and hydrogen at a suitable temperature as, for example, 500° C is supplied by a torch 67 onto the side of the lead array opposite the chip 39 to cause the bumps 52 to be bonded to the leads 64 as shown in FIG. 19.

As soon as the bonding operation has been completed, the sequence is repeated. The die carrier 56 is stepped into the next position and so is the strip sheet 63, and thereafter the next die 41 is bonded to the next array. In this manner, the semiconductor chips or dies 41 are mounted in rows on the rows of lead arrays 62 provided in the sheet. After each row of lead arrays in the sheet has been fitted with a semiconductor chip or body 41, the sheet 63 is advanced and the next row of arrays is fitted with semiconductor chips. When the sheet 63 is continuous, this process can be carried out continuously.

Figures 18A, 18B:
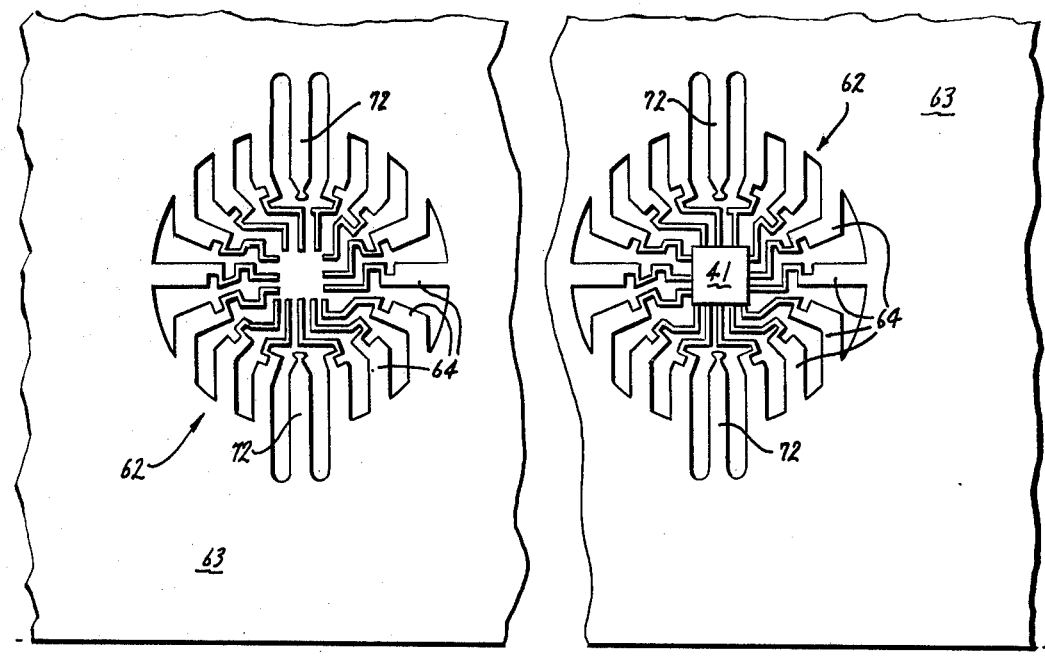
FIGS. 18A and 18B are enlarged views of plan views shown in FIGS. 17A and 17B.

The step of bonding the semiconductor bodies or chips 41 to the lead arrays 62 is followed by an encapsulation process. Prior to encapsulation, the portions of the leads of the lead array making contact with the bumps 52 are coated with a suitable insulating material such as an ultra-pure silicon resin. A first encapsulation means 71 is provided for encapsulating the semiconductor body 41, the inner extremities of the leads 64 and the inner extremity of each of the support tabs 72. As shown in FIGS. 18A and 18B, the lead array 62 is provided with a pair of diametrically extending blind support tabs 72 formed from the sheet 63 and which are spaced from the leads 64. The inner extremities of the support tabs 72 do not extend inwardly as far as the leads 64 and their inner ends are spaced outwardly from the inner ends of the leads 64. The inner extremities of support tabs 72 are such that they will be encapsulated by the outer margin of the first encapsulation means 71 as shown in FIG. 16C.

The first encapsulating means 71 can be formed in any suitable manner such as by injection molding by utilizing a multi-cavity mold. By way of example, a multi-cavity mold could be provided with sufficient cavities for each row of lead arrays in the strip or sheet 63 so that successive rows of the chips 41 can be encapsulated. Alternatively, if desired, a great many as, for example, 100 or 360 cavity molds can be provided to permit simultaneous encapsulation of that many semiconductor bodies. As can be seen from FIG. 20A, the first encapsulation means 71 is generally cylindrical in shape and is relatively squat to give the appearance of a pill. The pill forms what can be called a pill-like package 73 which consists of the first encapsulating means 71 and the leads 64 extending therefrom. Thus, it can be seen that pill-like package 73 has the appearance of a spider and for that reason has been called a spider.

It can be seen that the first encapsulating means 71 is relatively small and for that reason a high quality encapsulating material can be utilized. By way of example, an epoxy molding compound can be utilized which is tailored for maximum compatibility with the chip surface parameters and which has high chemical purity and low ionic contamination. It also can be tailored for a low thermal expansion coefficient to approximately match the thermal expansion characteristics of the other materials which form the package. This serves to minimize thermal stresses during thermal cycling. In addition, it is important that the material provide an excellent moisture seal around the metal leads and also impart mechanical strength to the package.

After the first encapsulation means 71 has been formed, the outer extremities of the leads 64 are sheared or trimmed as shown in FIG. 17D and 20B while leaving the two support tabs intact to provide a support for holding the pill-like package 73 within the strip or frame 63. At this time, the pill-like package 73 is tested for its electrical characteristics by suitable testing apparatus. The pill-like packages are then classified and coded in a suitable manner such as by magnetic ink. During this testing operation, the two blind support tabs 72 retain the pill-like package 73 in alignment within the sheet or frame 63.

If desired, the pill-like packages 73 can be shipped to the customer in this manner; that is, with the package being retained by the support tabs 72 within the strip or frame 63. This facilitates the customer checking the pill-like packages.

In the event it is desired to package the pill-like packages in a conventional dual in-line package, the pill-like packages 73 can be transferred as shown in FIG. 17 to a strip of dual in-line frames 76 as shown in FIS. 17E and 20. A lead frame strip 76 is shown in FIGS. 21A-21F. Although various types of materials such as Kovar have been used for such lead frame strips, it has been found advantageous in the present embodiment to utilize a low carbon steel such as 1010 steel for the lead frame. It has been found that the use of steel is advantageous because it has substantially better thermal dissipation (3 to 1) than Kovar and also because it is quite inexpensive. In order that the leads in the lead frame can be readily soldered, it is preferable that the steel be tin-plated with a thin layer of tin.

The lead frame 76 is provided with a plurality of second leads 77 which are carried by laterally extending webs 78 formed integral with the longitudinally extending frame 79. The outer ends of the leads 77 extend in two opposite directions and are generally in alignment with each other as shown in FIG. 21A. The inner extremities of the leads 77 extend inwardly to form a predetermined pattern as, for example, the circular pattern shown in FIG. 21A which corresponds to the pattern of the outer extremities of the leads 64 of the pill-like package 73. The inner extremities of the leads 77 are formed by the use of suitable molds or dies 78 and 79 (see FIG. 23) to provide outwardly and upwardly extending wedge-like portions 77a which somewhat resemble chisel points. The outer sides of the portions 77a are generally vertical, whereas the inner sides of the portions 77a form an angle of approximately 30° with respect to the vertical. During the forming operation, it has been found that the tin which is on the surface of the steel is pushed or forced away from the point of the portion 77a so that the underlying steel is exposed. As can be seen from FIG. 21A, the portions 77a generally lie in a circle. The outer extremities of the leads 77 also have a predetermined pattern and, as shown, are slightly reduced in size so that they can be readily inserted into holes in PC boards and the like.

The transfer of the pill-like packages 73 to the second leads 77 of each of the lead frames in the lead frame strip 76 can be accomplished automatically if desired. Thus, by the use of a suitable x-y table, each pill-like package 73 can be stepped so it underlies a pill transfer chuck 81, which also serves as an upper welding electrode. The lead frame strip 76 can be similarly advanced so that the second leads 77 are in registration with the leads 64 and are engaged by a lower welding electrode 82 (see FIG. 22B). The wedge-shaped portions 77a, which lie in a predetermined pattern, are brought into engagement with the outer extremities of the leads 64 and a welding operation is carried out whereby the leads 64 are welded to the raised portions of the leads 77a. This can be carried out at a suitable temperature as, for example, 1000° C. Thus, the inner extremities of all 14 leads are welded to the outer extremities of the leads 64 in a single operation.

The raised portions or points 77a have a suitable height as, for example, 6 mils and have a tip radius of less than 1 mil. This assures that excellent welds are obtained between the outer extremities of the leads of the pill-like package and the inner extremities of the second leads. In order to obtain precision welding it is desirable that the inner extremities of the second leads 77 be coplanar within 0.002 of an inch. This helps ensure excellent contact between the second leads 77 and the outer extremities of the leads 64. This is particularly advantageous where electrical welding is utilized because as soon as there is initial welding, a controlled current flow and a controlled weld will result.

When the first leads are formed of Kovar and the second leads are formed of steel, the Kovar-to-steel weld will melt at approximately 900° C. so that it can be seen that by utilizing a temperature of 1000° C., an excellent weld can be obtained. This excellent weld is made possible because of the use of tin-plated steel and the coined outer ends from which the tin has been removed. This welding is accomplished before the pill-like package is separated from the sheet or frame 63 so that the pill-like package has the proper orientation. After the welding operation has been completed, the pill-like package can be separated from the sheet or frame 63 as represented by FIG. 21B. The lead frame or strip 76 is advanced to the next location as is the sheet 63 and the same process is repeated. Alternatively, the strip 76 can be advanced or indexed while holding the sheet 63 stationary to cause the pill-like package 73 with its leads to be separated or ripped from the sheet 63.

After the pill-like package has been transferred and welded to the second leads 77 of the lead frame strip 76, it can be encapsulated in a second encapsulation means 86. The second encapsulation means 86 can take any suitable form as, for example, rectangular, as shown in FIG. 21C. The second encapsulation means encapsulates the pill-like package including the portions of the leads extending therefrom, and the inner extremities of the second leads in such a manner that the outer extremities of the second leads are free of the second encapsulation means. The second encapsulation means 86 can be formed in a conventional manner such as by injection molding. Any suitable material can be utilized for the second encapsulation means. Since the semiconductor body 41 has also been encapsulated in a high quality first encapsulation means, the second encapsulation means can be of substantially lesser quality so that it will be less expensive and meet other needed requirements. Thus, if a plastic is chosen, it should be of good mechanical strength. In addition, it should be capable of forming a very good moisture-proof bond with the second leads. In general, the principal concern for the first encapsulation means is high reliability whereas the second encapsulation means should provide the necessary mechanical strength at low cost.

After the second encapsulation means 86 has been formed, as shown in FIG. 21C, the lead frame can be stepped or advanced into a station in which the webs 78 interconnecting the leads are stripped away as shown in FIG. 21D. As soon as these webs or tie-bars 78 have been removed, the semiconductor device contained therein can be checked by making contact with the leads 77. The devices can be then classified and magnetically coded. The second encapsulation means 86 also engages the innermost extremities of pairs of blind support tabs 87 provided on opposite sides of the frame 79. These support tabs are utilized for supporting the dual in-line package 88 so that it can be tested while retained with the frame 79.

After electrical check, the dual in-line packages can be symbolized as, for example, with a trademark and code. After this has been completed, the outer extremities of the leads 77 are bent downwardly so that they extend in spaced parallel planes shown in FIG. 21E. The lower extremities of the leads 77 are then coated with solder so that the dual in-line packages can be readily mounted in the printed circuit boards. This can be accomplished in any suitable manner such as, for example, by running the strip through a solder bath in which the lower extremities of the leads 77 pass through the bath. Thereafter, the dual in-line packages 88 can be forced out of the frame 79, forcing the package downwardly out of the frame which causes the tabs 87 to be bent downwardly to release the package. The dual in-line packages then can be automatically filled into shipping tubes for shipment to the customer. Alternatively, if it is desired, the dual in-line packages 88 can remain in the frame 79 and the frame with dual in-line packages in the same can be coiled for shipment to the customer. The customer can then remove the dual in-line packages 88 as they are used.

It should be appreciated that although the dual encapsulation hereinbefore described utilized two plastic packages, one or both of the packages can be hermetically sealed ceramic packages. Thus, as shown in FIG. 24A, there can be provided two cup-shaped alumina ceramic parts 91 which have recesses 93 formed therein and having a glass frit 93 on opposing faces. These two parts 91 are then assembled about the package 41 and are carried by each of the lead arrays 62 on the sheet or frame 63. The parts are then heated to a suitable temperature to melt the glass frit 93 to form a glass seal 96 adjacent the inner extremities of the leads 64 so that the outer extremities of leads 64 are free. As is shown in FIG. 24B, the semiconductor chip 41 as well as the inner extremities of the leads 64 are sealed within the recesses 92 provided in the parts 91. A pill-like package 97 is again formed which has a small central body and outwardly extending leads to again resemble a spider. This pill-like package 97 can be marketed in this configuration to the customer or, if desired, can be encapsulated in a plastic package as, for example, the dual in-line package hereinbefore described.

In the event it is desirable to have a pill-like package with good heat dissipation characteristics for the semiconductor body or chip 41, a package such as that shown in FIG. 25 can be utilized. As shown therein, the die 41 can be attached to one of the ceramic bodies or parts 91 by utilization of metallization 101 formed of a suitable material such as molymanganese and gold. This die attach can be accomplished if desired before the leads 64 are attached. The leads 64 can thereafter be brought into contact with the pads carried by the semiconductor body and bonded thereto. Thereafter, the top part 91 can be put in place and the glass seal 96 formed in the manner hereinbefore described.

An external heat sink 102 of a suitable material such as copper is secured to the ceramic part 91 carrying the semiconductor body 41 in a suitable manner such as by formation of a silicon-gold eutectic. The assembly shown in FIG. 21 can be used as is or can be packaged in a suitable plastic package such as a dual in-line package with the heat sink 102 being disposed within, or, alternatively, extending out of the second encapsulation means.

Figure 26:
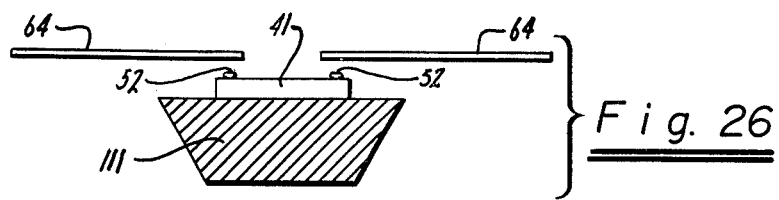
FIGS. 26, 27 and 28 are cross-sectional views showing the manner in which a heat sink can be incorporated in the molded pill-like package incorporating the present invention.
Figure 27:
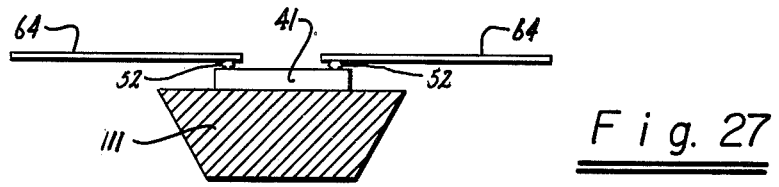
Figure 28:
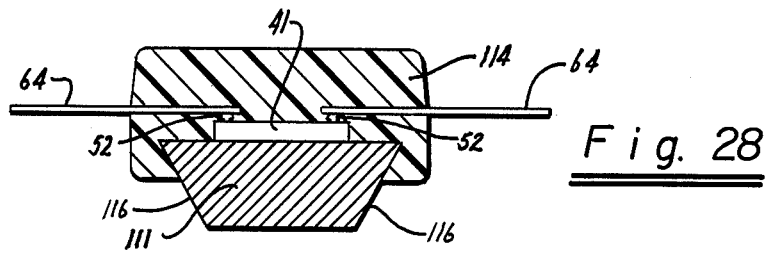

Another embodiment of the semiconductor lead structure and assembly and the method for fabricating the same is shown in FIGS. 26–28. As shown therein, a metallic slug 111 formed of a suitable material such as copper is bonded to the back side of the semiconductor chip, die or body 41 by suitable means such as by placing a gold layer onto the surface of the slug 101 which is to come in contact with the chip 41 and to thereafter form a silicon-gold eutectic for the bond. The slug 111 can have any desired configuration. However, it should have a sufficient mass so that it will have good heat dissipation characteristics for the chip 41. In addition to copper, metallized berylium oxide or metallized aluminum oxide can be utilized. It should be appreciated that although it is desirable to utilize a metal, it is not necessary to have a material which is conducting from the point of view of electrical conduction. For example, it can be an insulator as far as electrical conduction is concerned and still have sufficient heat dissipating qualities. The chip 41 is then bonded to leads 64 of an array 62 by forming a bond between the bumps 52 provided on the chip 41 and the inner extremities of the leads 64 as hereinbefore described.

After the assembly of the semiconductor chip 41 and the slug 111 have been bonded to an array, the semiconductor chip 41 and the inner extremities of the leads 64 as well as a portion of the heat sink slug 111 are encapsulated in first encapsulating means 114 formed of a suitable material such as plastic in a manner similar to that hereinbefore described. It is desirable that the first encapsulating means 114 be formed in such a manner so that the heat sink slug 111 extends out of the first encapsulating means as shown in FIG. 28. As shown in FIGS. 26, 27 and 28, the heat sink slug can be provided with sloping side walls so that a dove-tailed arrangement is formed with the first encapsulating means 114 whereby the first encapsulating means 114 serves to retain the heat sink slug 111 firmly within the package so that it will not separate from the semiconductor chip 41 or cause the semiconductor chip 41 to be separated from the leads 64. The remainder of the steps in forming the pill-like packages is similar to that hereinbefore described. The only difference is that the heat sink slug 111 has been provided which extends out of the first encapsulation means 114. This permits the pill-like packages as shown in FIG. 23 to be utilized in this condition, in which case the exposure of the heat sink slug 111 to the exterior provides greatly enhanced heat dissipation qualities to the package so that the semiconductor body or chip 41 can be utilized in power applications. If still additional heat dissipation requirements are necessary, external heat sink means can be secured to the exterior surface of the heat sink slug 111.

Figure 29:
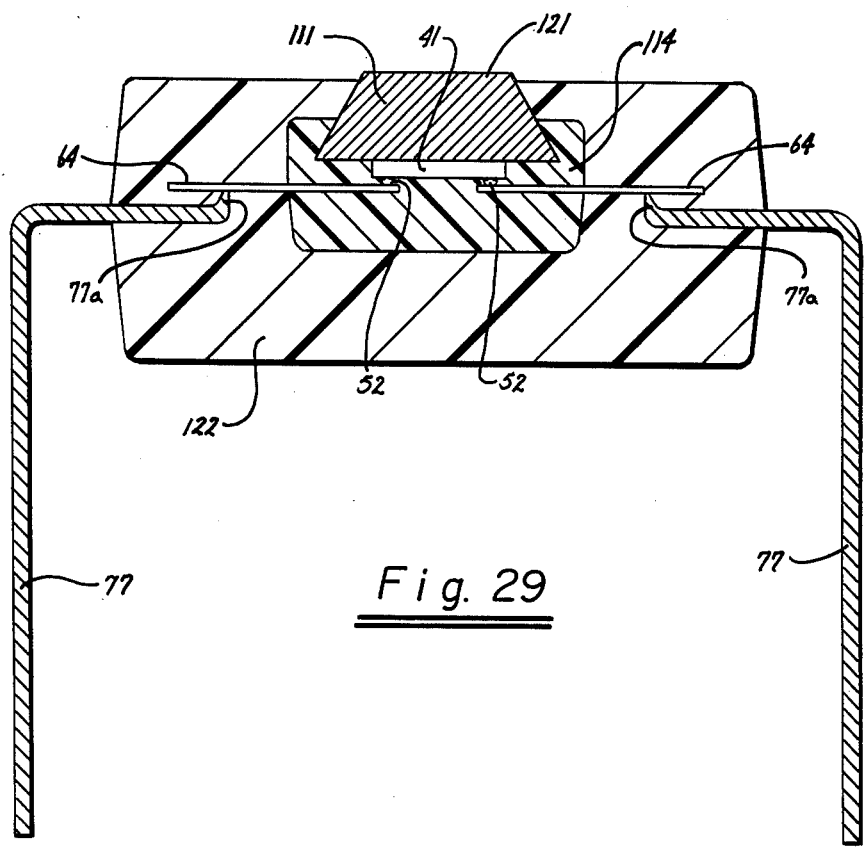
FIG. 29 is a cross-sectional view showing the pill-like package of the type shown in FIG. 28 incorporated in a dual in-line package.

Alternatively, as shown in FIG. 29, a pill-like package of the type shown in FIG. 28 can be incorporated in second encapsulation means such as provided by a dual in-line package as shown in FIG. 29. In such event, it may be desirable to utilize a larger heat sink slug 121 as shown in FIG. 29 so that the same will extend out of second encapsulation means 122. It can be seen that the pill-like package can be formed in the same manner as hereinbefore described with the heat sink slug 121. Thereafter, the pill-like package can be inverted and the outer extremities of the leads 64 can be bonded or welded to the inner extremities of the leads 77 in the manner hereinbefore described. The second encapsulation means 122 formed of a suitable material such as plastic can then encapsulate the first encapsulating means and the other extremities of the leads 64 and the inner extremities of the leads 77 with the heat sink slug 121 extending out of the same as shown in FIG. 29. Although the heat sink slug 121 can be completely encapsulated within the second encapsulation means, it is generally desirable that it extend out of the second encapsulation means to provide additional heat dissipation characteristics as, for example, to make direct contact with air passing over the package shown in FIG. 29. Alternatively, additional heat sink means (not shown) can be secured to the heat sink slug 121.

With the construction shown in FIGS. 24–29, it can be seen that the pill-like package can be formed in such a manner so that it has excellent heat dissipation characteristics to thereby permit the pill-like package to be utilized in power applications. It also can be utilized in connection with dual in-line packages and the like.

From the foregoing it can be seen that a reflow soldering system is utilized for bonding the integrated circuit chips to an array of etched frames. All connections independent of the number of electrical terminals provided on the semiconductor assembly are made in one pass with a forming gas torch within less than one-half second. Die handling is performed without disturbing the accurate geometrical alignment of the dice in the wafer by mounting the wafers prior to separating and transfer of the chip in the bonding station. After bonding, the assembly is encapsulated with a high purity silicone resin and molding material to protect the chip from adverse environmental influences. The pill-like package leads are then trimmed to enable electrical testing of the packages while they are being supported within the original frame by blind support tabs. In this way, the pill-like package can be tested to ascertain that it will meet final specifications as, for example, a.c., d.c., speed, heat and cold, etc. by the use of automatic equipment. The pill-like packages are pushed out of the frame and without losing their orientation, they are transferred into dual in-line package frames and thereafter by the use of automatic equipment, molding, tie bar trimming, testing, classifying, symbolizing, bending and tin coating of the leads can be performed at high speed.

Also from the foregoing it can be seen that an improved semiconductor lead structure, assembly and method have been provided. As disclosed, it can be seen that a fully automatic system can be readily provided, which includes die separation, die handling, bonding, trimming, testing, molding, etc. Also it can be seen that overlapping order principles are used for moving the die from the wafer carrier and into the spider-like lead frames. The alignment of the semiconductor body is maintained throughout the process commencing with incorporation in the pill-like package. Thereafter, the alignment of the pill-like package is controlled so that it will be properly positioned on the dual in-line lead frames. It can be seen that the process is readily adaptable to numerically controlled equipment for automatically handling the parts and for processing the same. The packages can be handled either in the large sheets or strips. When handled in strips, the strips can be coiled to permit coil-to-coil processing making possible continuous bonding, molding, testing, symbolizing, etc. When orders are changed as, for example, when going from the pill-like package frame to the dual in-line package frame, the order in one is retained until the order in the other is established. Thus, handling in coiled strips is very feasible. Sheet processing of the pill-like package frames to permit simultaneous formation of parts for a large quantity of pill-like packages in at least certain of the steps such as etching or molding is very advantageous. The construction of the frames for the pill-like packages and the dual in-line frames with holding or support tabs which provide support after the electrically active leads have been severed is very advantageous to permit automatic testing without further handling by the human hand.

We claim:

1. In a method for fabricating a semiconductor assembly, providing a wafer having a plurality of semiconductor bodies formed therein with each of the semiconductor bodies having at least portions of an electrical circuit formed therein with contact pads in a predetermined pattern carried by the body and lying in a common plane, providing a thin metallic strip, forming a plurality of spaced arrays in said strip extending longitudinally of the strip with each array having a plurality of first leads arranged in a predetermined pattern, supplying semiconductor bodies from the wafer and bonding said semiconductor bodies to the spaced arrays provided on the strip, encapsulating the semiconductor body and the inner extremities of the leads to provide a pill-like package, separating the leads from the strip to provide an assembly while retaining the assembly in the strip by providing supports independent of the leads for supporting the assembly in the strip and testing electrical characteristics of the assembly by engaging the leads of the assembly while the assembly is being retained in the strip.

2. A method as in claim 1 together with the step of forming a plurality of second leads, bonding the inner extremities of the second leads to the outer extremities of the first leads in such a manner that the outer extremities of the second leads are free, and encapsulating the pill-like package and inner extremities of the outer leads to provide a dual in-line package.

3. In a method for forming a semiconductor assembly, providing a semiconductor body having at least a portion of an electrical circuit formed therein and with contact pads in a predetermined pattern carried by the body and lying in a common plane, forming a plurality of first leads into an array, bonding said first leads to the contact pads on the semiconductor body so that the first leads extend outwardly from the semiconductor body and have outer extremities which lie in a predetermined pattern, encapsulating the semiconductor body and the portions of the first leads in engagement with the contact pads and with the outer extremities of the first leads being free of the encapsulating material, providing a plurality of spaced second leads having inner extremities arranged in a predetermined pattern corresponding to the pattern of the outer extremities of the first leads, coining the inner extremities of the second leads so that they are provided with upstanding generally wedge-shaped portions, bonding the upstanding generally wedge-shaped portions of the inner extremities of the second leads to the outer extremities of the first leads, and encapsulating the first encapsulating means, the outer extremities of the first leads and the inner extremities of the second leads whereby the outer extremities of the second leads are free of the encapsulating material.

4. A method as in claim 3 wherein said second leads are formed of tin-plated steel.

5. A method as in claim 3 wherein said first leads are formed of Kovar.

6. A method as in claim 3 wherein a plurality of arrays of first leads are formed and wherein a semiconductor body is bonded to each array.

7. A method as in claim 3 wherein the semiconductor body is provided by directly removing the same from a semiconductor wafer having a plurality of semiconductor bodies formed therefrom.

8. In a method for forming a semiconductor assembly of the type in which each assembly includes a semiconductor body having at least a portion of an electrical circuit formed therein with contact pads in a predetermined pattern carried by the body and lying in a common plane, forming a plurality of lead arrays from a relatively thin sheet of electrically conducting material to provide a plurality of first leads which are integral with the sheet material while placing a semiconductor body in each array and bonding the contact pads of a semiconductor body to the inner extremities of the first leads while severing the first leads from the sheet to provide a plurality of pill-like packages each of which has leads extending outwardly therefrom supporting said pill-like packages in said sheet material independent of the leads of the pill-like package, electrically testing the pill-like packages while supported in said sheet material, providing a lead frame having a plurality of second leads carried thereby and bonding the inner extremities of the second leads to the outer extremities of the first leads.

9. A method as in claim 8 together with the step of encapsulating the pill-like packages and the inner extremities of the second leads.

10. A method as in claim 8 together with the step of forming convolutions in the first leads adjacent the point at which the first leads are bonded to the contact pads.

* * * * *